United States Patent
Lue et al.

(10) Patent No.: US 7,200,045 B2
(45) Date of Patent: Apr. 3, 2007

(54) METHOD FOR PROGRAMMING A CHARGE-TRAPPING NONVOLATILE MEMORY CELL BY RAISED-VS CHANNEL INITIALED SECONDARY ELECTRON INJECTION (CHISEL)

(75) Inventors: Hang-Ting Lue, Hsinchu (TW); Kuang Yeu Hsieh, Hsinchu (TW)

(73) Assignee: Macronix International Company, Ltd. (TW)

( * ) Notice: Subject to any disclaimer, the term of this patent is extended or adjusted under 35 U.S.C. 154(b) by 0 days.

(21) Appl. No.: 11/026,708

(22) Filed: Dec. 30, 2004

(65) Prior Publication Data

US 2006/0146614 A1 Jul. 6, 2006

(51) Int. Cl.
*G11C 11/34* (2006.01)
(52) U.S. Cl. .............................. 365/185.28; 365/185.18
(58) Field of Classification Search ........... 365/185.28, 365/185.18, 185.24
See application file for complete search history.

(56) References Cited

U.S. PATENT DOCUMENTS

| | | | |
|---|---|---|---|
| 5,598,369 A * | 1/1997 | Chen et al. ............... | 365/185.3 |
| 5,838,617 A | 11/1998 | Bude et al. | |
| 6,934,190 B1 * | 8/2005 | Liu et al. ................ | 365/185.19 |
| 6,972,997 B2 * | 12/2005 | Ishimaru et al. ......... | 365/185.29 |
| 2004/0047186 A1 * | 3/2004 | Tsai et al. .............. | 365/185.29 |
| 2004/0130951 A1 * | 7/2004 | Forbes ................... | 365/189.01 |
| 2005/0180210 A1 * | 8/2005 | Harari et al. ........... | 365/185.03 |
| 2006/0050553 A1 * | 3/2006 | Yeh ........................ | 365/185.01 |

* cited by examiner

*Primary Examiner*—Michael Tran
(74) *Attorney, Agent, or Firm*—Martine Penilla & Gencarella, LLP

(57) ABSTRACT

A raised-Vs Channel Initialed Secondary Electron Injection is disclosed to program a charge-trapping nonvolatile memory cell. The source of the charge-trapping nonvolatile memory cell is applied with a positive source voltage, and the drain of the charge-trapping nonvolatile memory cell is applied with a positive drain voltage, wherein the positive drain voltage is greater than the positive source voltage. The substrate of the charge-trapping nonvolatile memory cell is grounded. A positive gate voltage is applied to the polysilicon gate of the charge-trapping nonvolatile memory cell.

19 Claims, 5 Drawing Sheets

METHOD FOR PROGRAMMING A CHARGE-TRAPPING NONVOLATILE MEMORY CELL BY RAISED-VS CHANNEL INITIALED SECONDARY ELECTRON INJECTION (CHISEL)

BACKGROUND OF THE INVENTION

1. Field of the Invention

The present invention relates generally to a method for programming a flash memory cell, and more particularly, to a method for programming a 2-bit charge-trapping nonvolatile memory cell using raised-$V_S$ channel Initialed secondary electron Injection (CHISEL) programming method.

2. Description of the Related Art

Widely used in semiconductor industry, charge-trapping nonvolatile memory cells are type of memory cells that store charges at its charge-trapping layer and retain the stored charges when power is remove. If a charge-trapping nonvolatile memory cell can store charges at both ends of the charge-trapping layer, this charge-trapping nonvolatile memory cell is capable of 2-bit operations.

A charge-trapping nonvolatile memory cell can be programmed by a traditional channel hot electron (CHE) programming method. However, the traditional CHE programming method has the drawbacks of large programming current and low programming speed. In order to overcome the shortcomings of the CHE programming method, a conventional channel Initialed secondary electron Injection (CHISEL) programming method is used to program a charge-trapping nonvolatile memory cell by grounding the source and applying a negative substrate voltage to enhance the secondary electron generation.

Although the conventional CHISEL programming method is more efficient than the traditional CHE programming method, the major drawback of the conventional CHISEL programming method is that a negative voltage needs to be applied to the substrate of the charge-trapping memory cell to be programmed. Since the substrate is highly capacitive and resistive for a large sector of the charge-trapping memory cells, the charging and discharging of the substrate for a charge-trapping nonvolatile memory cell will result in long response time and large power consumption.

In view of the foregoing, there is a need for an improved CHISEL programming method that will avoid the need of charging and discharging the highly capacitive and resistive substrate of a charge-trapping nonvolatile memory cell.

SUMMARY OF THE INVENTION

Broadly speaking, the present invention fills this need by providing a raised-Vs channel initialed secondary electron Injection (CHISEL) programming method for programming a charge-trapping nonvolatile memory cell.

In accordance with one aspect of the present invention, a raised-Vs CHISEL programming method is provided to program a charge-trapping nonvolatile memory cell. A positive source voltage is applied to the source of the charge-trapping nonvolatile memory cell to be programmed, and a positive drain voltage is applied to the drain of the charge-trapping nonvolatile memory cell. The positive drain voltage is greater than the positive source voltage. In one embodiment, the positive drain voltage is greater than a combinative voltage including the positive source voltage plus a voltage factor, wherein the voltage factor is about 2V. The substrate of the charge-trapping nonvolatile memory cell is grounded. A positive gate voltage is applied to the polysilicon gate of the charge-trapping nonvolatile memory cell.

In accordance with another aspect of the present invention, a raised-Vs CHISEL programming method is provided to program a charge-trapping nonvolatile memory array. First of all, a memory cell to be programmed is selected from the charge-trapping nonvolatile memory array. A first positive voltage and a second positive voltage are applied to a first local bit line and a second local bit line, respectively. The first local bit line is connected to the source of the memory cell to be programmed, while the second local bit line is connected to the drain of the memory cell to be programmed. The second positive voltage is greater than the first positive voltage. In one embodiment, the second positive voltage is greater than a combinative voltage including the first positive voltage plus a voltage factor, wherein the voltage factor is about 2V. A third positive voltage is applied to the polysilicon gate of the memory cell to be programmed. The substrate of the charge-trapping nonvolatile memory array is grounded.

In accordance with yet another aspect of the present invention, a raised-Vs CHISEL programming method is provided to program a charge-trapping nonvolatile memory cell. A source terminal, a drain terminal, a gate terminal, and a substrate terminal are connected to the source, the drain, the polysilicon gate, and the substrate of the charge-trapping nonvolatile memory cell, respectively. A positive source voltage is applied to the source terminal of the charge-trapping nonvolatile memory cell to be programmed, and a positive drain voltage is applied to the drain terminal of the charge-trapping nonvolatile memory cell. The positive drain voltage is greater than the positive source voltage. In one embodiment, the positive drain voltage is greater than a combinative voltage including the positive source voltage plus a voltage factor, wherein the voltage factor is about 2V. The substrate terminal of the charge-trapping nonvolatile memory cell is grounded. A positive gate voltage is applied to the gate terminal of the charge-trapping nonvolatile memory cell.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
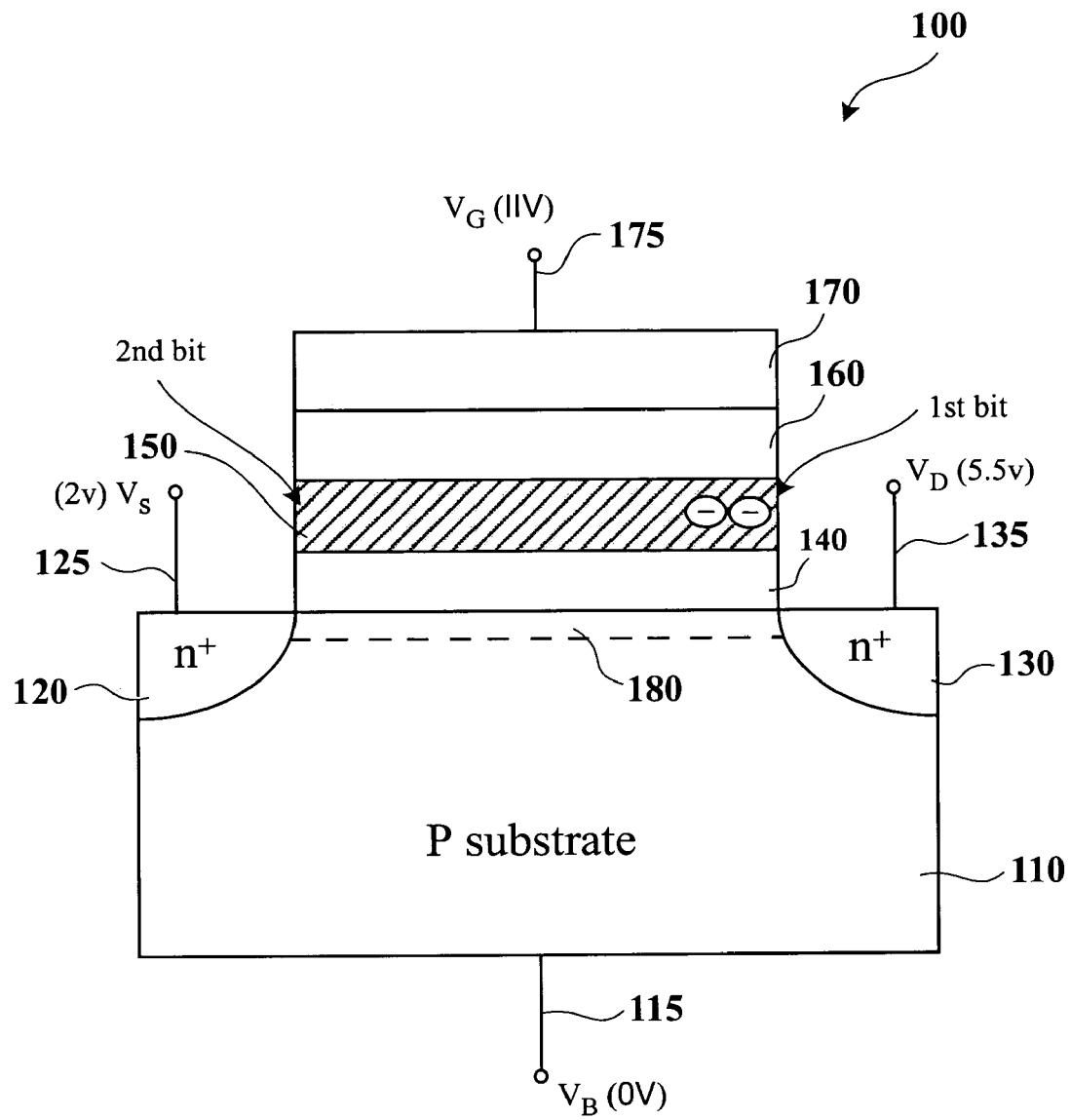
FIG. 1 shows a cross-sectional view of a charge-trapping nonvolatile memory cell that is programmed by a raised-Vs channel Initialed secondary electron Injection (CHISEL) programming method in accordance with one embodiment of the present invention.

FIG. 1 shows a cross-sectional view of a charge-trapping nonvolatile memory cell 100 that is programmed by using a raised-$V_S$ channel Initialed secondary electron Injection (CHISEL) programming method in accordance with one embodiment of the present invention. The charge-trapping nonvolatile memory cell 100 includes a P substrate 110 with N+ doped source 120 and drain 130. A charge-trapping layer 150 is sandwiched between a bottom oxide layer (BOX) 140 and a top oxide layer (TOX) 160 disposed over the substrate 110. A polysilicon gate 170 is disposed over the TOX 160. The substrate terminal 115 is connected to the substrate 110, the source terminal 125 is connected to the source 120, the gate terminal 175 is connected to the polysilicon gate 170, and the drain terminal 135 is connected to the drain 130. A channel 180 is formed under the BOX 140 and between the source 120 and the drain 130.

The charge-trapping nonvolatile memory cell 100 can store charges at both ends of the charge-trapping layer 150. The charges stored at the right end of the charge-trapping layer 150 is considered the first bit for the charge-trapping nonvolatile memory cell 100, while the charges stored at the left end of the charge-trapping layer 150 is considered the second bit for this charge-trapping nonvolatile memory cell 100. As shown in FIG. 1, only the first bit of the charge-trapping nonvolatile memory cell 100 is programmed for the present embodiment.

The charge-trapping layer 150 could be a layer of silicon nitride ($Si_3N_4$), aluminum oxide ($Al_2O_3$), or hafnium oxide ($HfO_2$). Of course, the exemplary materials used for the charge-trapping layer 150 are not intended to be exhaustive nor limit the invention to the precise materials disclosed.

In the presented embodiment, when the raised-$V_S$ CHISEL programming method is used to program the first bit of the charge-trapping nonvolatile memory cell 100, a source voltage ($V_S$=2V) and a drain voltage ($V_D$=5.5V) will be applied to the source terminal 125 and the drain terminal 135, respectively, while the substrate is grounded ($V_B$=0V). The gate terminal 175 is applied with a gate voltage ($V_G$=11V) to generate channel hot electrons. The voltage bias between the source 120 and the substrate 110 will enhance the secondary hot electron generation.

In one embodiment, for programming the first bit of the charge-trapping nonvolatile memory cell 100, the source voltage $V_S$ ranges from about 0.5V to about 3V, the drain voltage $V_D$ is greater than a combinative voltage including the source voltage plus a voltage factor, i.e., $V_D > V_S$+voltage factor. In one embodiment, the voltage factor is about 2V. Likewise, for programming the second bit of the charge-trapping nonvolatile memory cell 100, the voltage values for the source 120 and the drain 130 are switched. The substrate 110 is grounded and the gate voltage $V_G$ ranges from about 6V to about 12V for programming either the first bit or the second bit of the charge-trapping nonvolatile memory cell 100.

Because of the increased source voltage $V_S$, as compared with the grounded source voltage used in the conventional CHISEL programming method, the gate overdrive $V_{GS}$ (the voltage bias between the source 120 and the substrate 110) is reduced. As a result, when the charge-trapping nonvolatile memory cell 100 is programmed by the raised-$V_S$ CHISEL programming method, the programming current is reduced due to the reduced gate overdrive $V_{GS}$ and the body effect caused by the source voltage $V_S$. Furthermore, since the substrate 110 of the charge-trapping nonvolatile memory cell 100 does not need to be charged and discharged, the programming speed is greatly increased and the power consumption is reduced.

Figure 2:
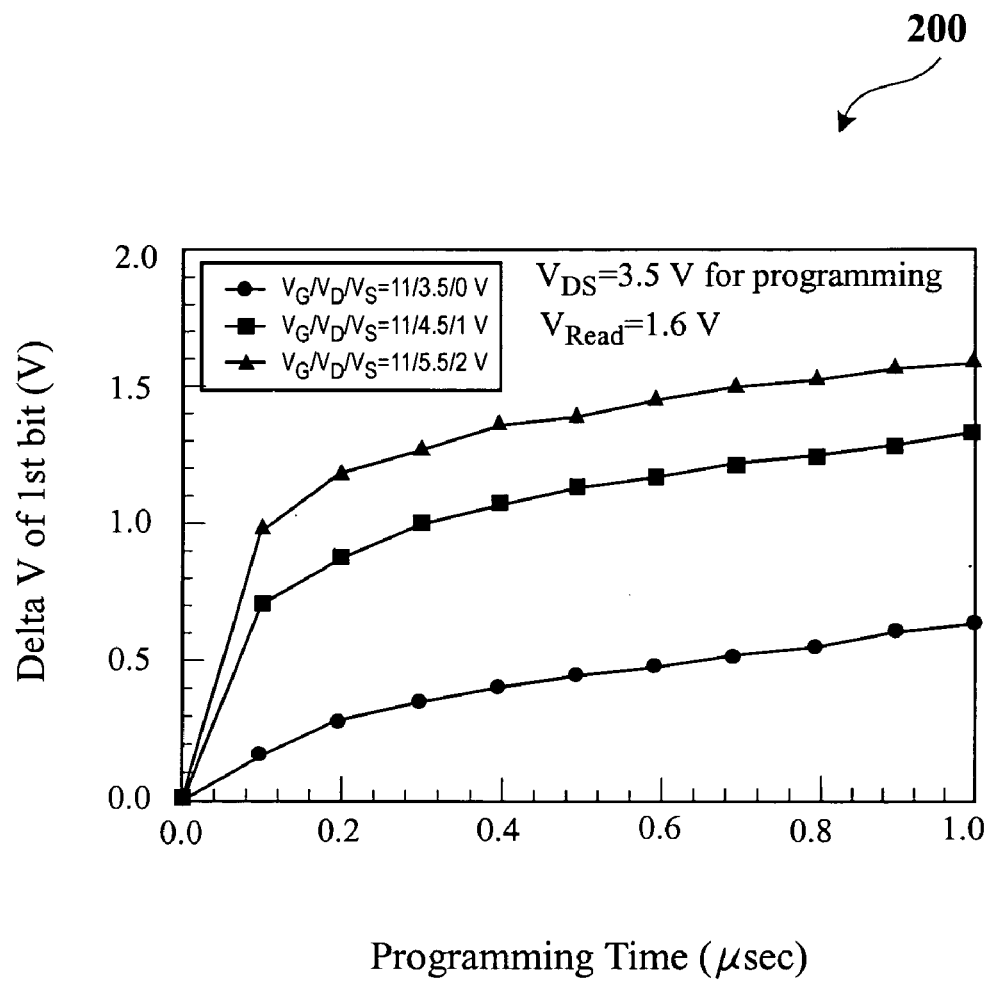
FIG. 2 is a programming speed comparison graph showing the delta threshold voltage $V_T$ of the first bit of a charge-trapping nonvolatile memory cell as a function of the programming time in accordance with one embodiment of the present invention.

FIG. 2 is a programming speed comparison graph 200 showing the delta threshold voltage $V_T$ of the first bit of the charge-trapping nonvolatile memory cell 100 as a function of the programming time in accordance with one embodiment of the present invention. The delta threshold voltage $V_T$ of the first bit of the charge-trapping nonvolatile memory cell 100 is the threshold voltage difference between the threshold voltages of the first bit before and after it is programmed.

As shown in FIG. 2, three different source voltages ($V_S$=0V, 1V, 2V) are respectively applied to the source terminal 125 of the charge-trapping nonvolatile memory cell 100 to program the first bit. The drain voltage $V_D$ increases as the source voltage increases such that voltage bias $V_{DS}$ between the source 120 and the drain 130 remains constant ($V_{DS}$=3.5V). The threshold voltage of the first bit of the charge-trapping nonvolatile memory cell 100 is read by a reverse read method by applying a read voltage Vread of 1.6V to the source terminal 125 and grounding the drain terminal 135 ($V_D$=0V). The programming speed comparison graph 200 indicates that raised-$V_S$ CHISEL programming method can increase the programming speed of the first bit of the charge-trapping nonvolatile memory cell 100 dramatically if the voltage bias $V_{DS}$ between the source 120 and the drain 130 remains the same during the programming operation.

Figure 3:
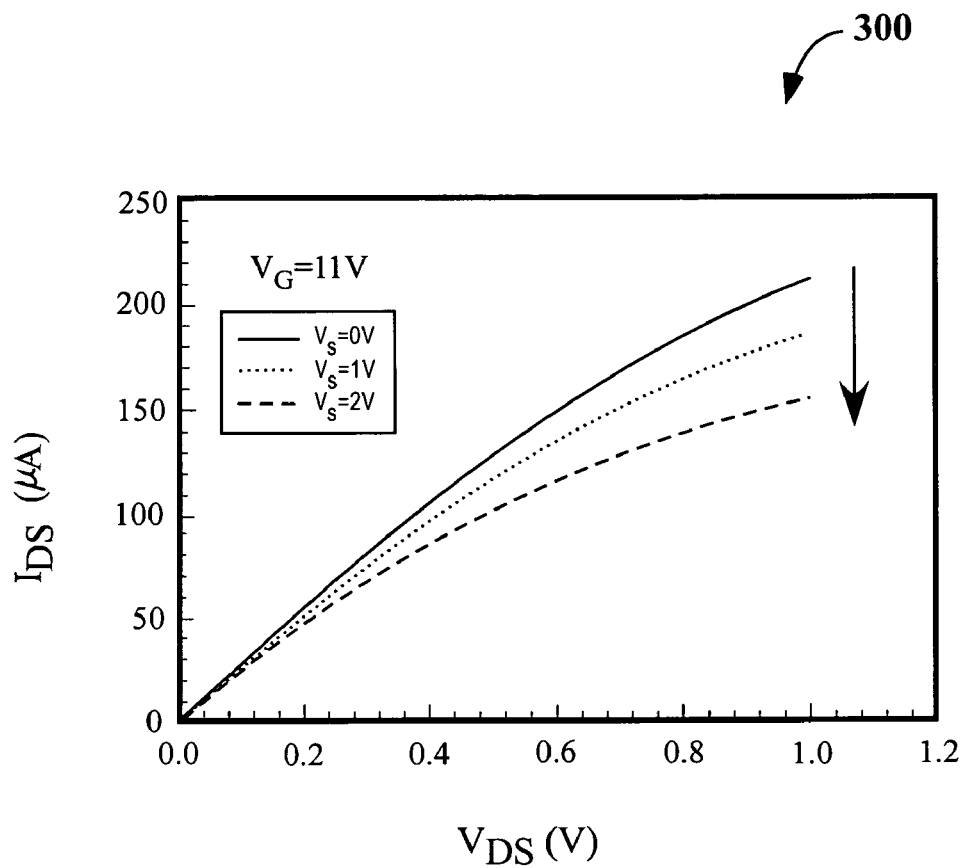
FIG. 3 is a channel programming current analysis graph showing the channel programming current as a function of the voltage bias between the drain and the source of a charge-trapping nonvolatile memory cell in accordance with one embodiment of the present invention.

FIG. 3 is a channel programming current analysis graph 300 showing the channel programming current $I_{DS}$ as a function of the voltage bias $V_{DS}$ between the drain 130 and the source 120 of the charge-trapping nonvolatile memory cell 100 in accordance with one embodiment of the present invention. For the channel programming current analysis graph 300, the gate voltage $V_G$ remains constant at 11V, the source voltage $V_S$ varies ($V_S$=0V, 1V, 2V). The substrate voltage $V_B$ is 0V.

As shown, the channel programming current $I_{DS}$ measured at the same $V_{DS}$ is decreased when the source voltage $V_S$ starts to increase. The reason is that the gate overdrive $V_{GS}$ is reduced due to the increase of the source voltage $V_S$. In addition, the body effect caused by the source voltage $V_S$ also decrease the channel programming current $I_{DS}$. Hence, the raised-$V_S$ CHISEL programming method is capable of decrease the channel programming current, which leads to reduced power consumption.

Figure 4:
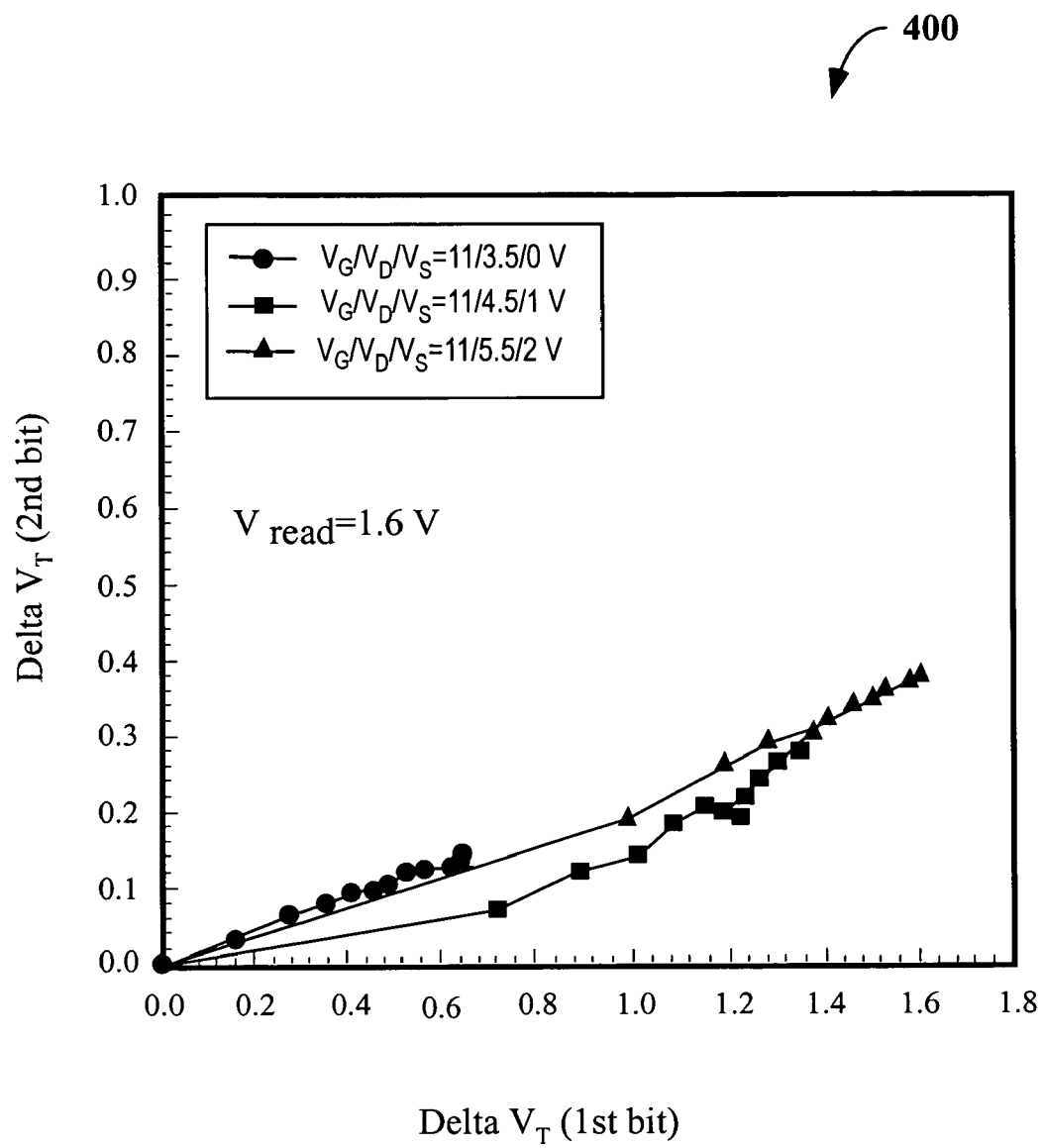
FIG. 4 is a second bit effect comparison graph showing the delta threshold voltage of the second bit as a function of the delta threshold voltage of the first bit for a charge-trapping nonvolatile memory cell in accordance with one embodiment of the present invention.

FIG. 4 is a second bit effect comparison graph 400 showing the delta threshold voltage $V_T$ of the second bit as a function of the delta threshold voltage $V_T$ of the first bit for the charge-trapping nonvolatile memory cell 100 in accordance with one embodiment of the present invention. The delta threshold voltages of the first bit and the second bit are respectively the threshold voltage differences between the threshold voltages of the first bit and the second bit before and after the first bit of the charge-trapping nonvolatile memory cell 100 is programmed.

For the second bit effect comparison graph 400, the substrate 110 is grounded, and the gate voltage $V_G$ remains constant at 11V. The source voltage $V_S$ varies ($V_S$=0V, 1V, 2V). The drain voltage varies too ($V_D$=3.5V, 4.5V, 5.5V) so that the voltage bias $V_{DS}$ between the source 120 and the drain 130 remains a constant of 3.5V. The read voltage Vread is 1.6V.

After the first bit of the charge-trapping nonvolatile memory cell 100 is programmed, the threshold voltage of the un-programmed second bit will also increase due to the second bit effect. A reduced second bit effect means that the increased threshold voltage of the un-programmed second bit is smaller for the same delta threshold voltage $V_T$ of the first bit. As shown in FIG. 4, the traditional CHE programming method ($V_S$=0V) causes more second bit effect than the raised-$V_S$ CHISEL programming method ($V_S$=1V and 2V). Therefore, the charge-trapping nonvolatile memory cell 100 programmed by the raised-$V_S$ CHISEL programming method can have better sense margin for 2-bit/cell operations due to the reduced second bit effect.

Figure 5:
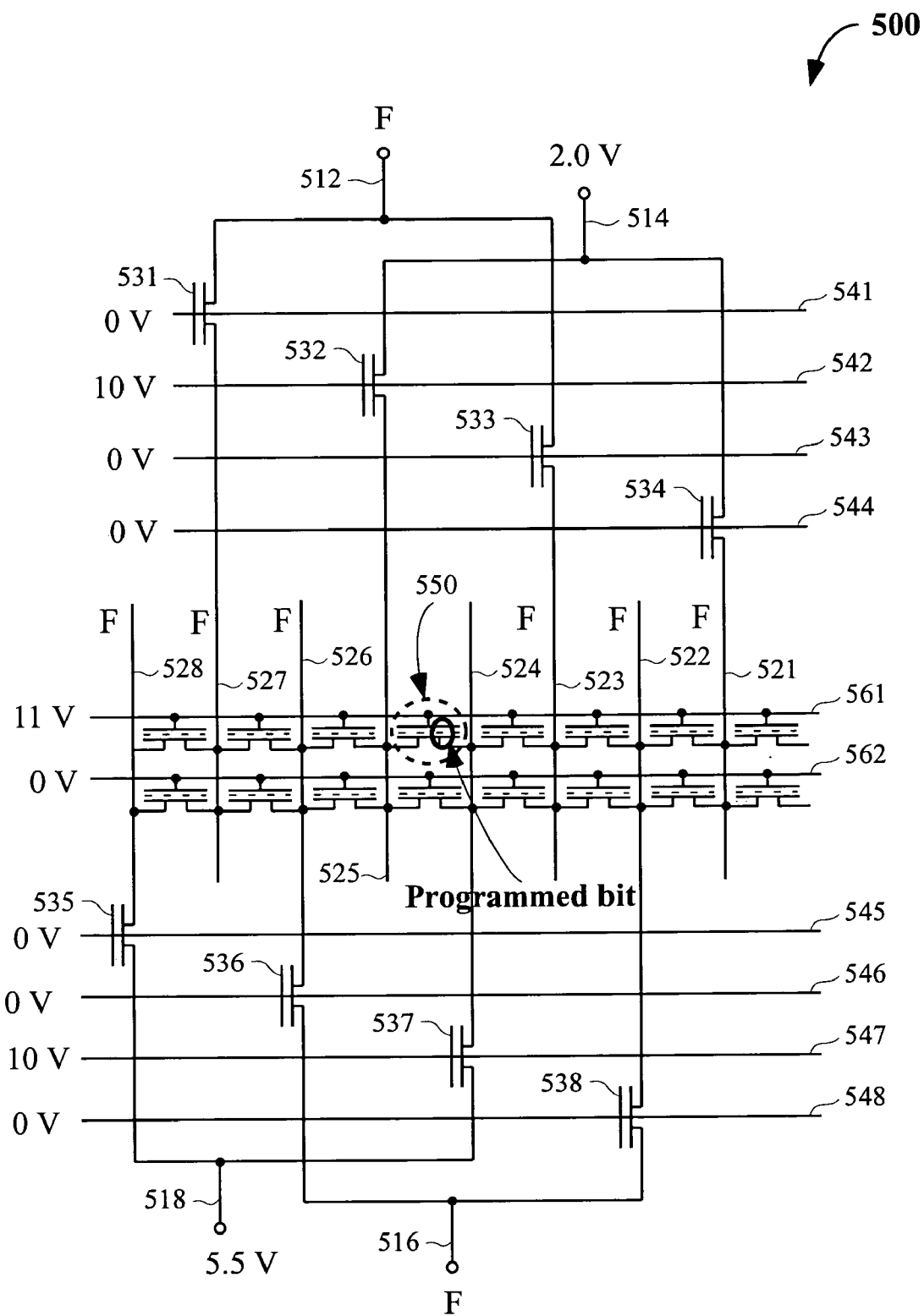
FIG. 5 shows an exemplary charge-trapping nonvolatile memory array that is programmed by the raised-$V_S$ CHISEL programming method in accordance with one embodiment of the present invention.

FIG. 5 shows an exemplary charge-trapping nonvolatile memory array 500 that is programmed by the raised-$V_S$ CHISEL programming method in accordance with one embodiment of the present invention. The charge-trapping nonvolatile memory array 500 is a virtual ground array.

The word lines 561 and 562, the global bit lines 512, 514, 516, and 518, and the local bit lines 521 to 528 are shown in FIG. 5. Eight bit line transistors (BLT) 531 to 538 control which local bit lines will be selected for the programming operation. The eight BLTs 531 to 538 are controlled by the eight BLT control lines 541 to 548, respectively. The design of the BLTs is similar to that of programming by hot-hole injection nitride electron storage (PHINES) cells or drain-sensing technique in nitride read only memory (NROM) cells.

To program the right bit of the memory cell 550 of the charge-trapping nonvolatile memory array 500 by the raised-$V_S$ CHISEL programming method, voltages of 2.0V and 5.5V are applied to the global bit lines 514 and 518, respectively. The global bit lines 512 and 516 are floating. Because the BLT control lines 542 and 547 are raised to 10V while the rest of BLT control lines remain grounded, the BLTs 532 and 537 are turned on, whereas the rest of BLTs remain off. As a result, voltages for the local bit lines 524 and 525 are 5.5V and 2.0V, respectively. The rest of local bit lines (521, 522, 523, 526, 527, and 528) are floating. The substrate of the memory cells of the charge-trapping nonvolatile memory array 500 is grounded.

The conventional CHISEL programming method requires a triple-well process between each memory sector due to the indispensable negative substrate voltage. However, since no charge and discharge of the substrate is required by the raised-$V_S$ CHISEL programming method, the triple-well process is eliminated for the charge-trapping nonvolatile memory array 500, resulting in a reduced array programming overhead. Since only the local bit lines are raised to program a memory cell in a charge-trapping nonvolatile memory array instead of the substrate, the programming speed of the raised-$V_S$ CHISEL programming method is very fast. The memory cell disturb issue can also be minimized because only the memory cells that share the same local bit line are affected.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modification s according to the particular purpose contemplated. The scope of the invention is intended to be defined by the claims appended hereto and their equivalents.

What is claimed is:

1. A method for programming a charge-trapping nonvolatile memory cell that is capable of 2-bit operations, comprising:
    applying a positive source voltage to a source of the charge-trapping nonvolatile memory cell;
    applying a positive drain voltage to a drain of the charge-trapping nonvolatile memory cell such that the positive drain voltage is greater than the positive source voltage;
    applying a positive gate voltage to a polysilicon gate of the charge-trapping nonvolatile memory cell; and
    grounding a substrate of the charge-trapping nonvolatile memory cell, the charge-trapping nonvolatile memory cell being capable of 2-bit operations.

2. The method for programming a charge-trapping nonvolatile memory cell as recited in claim 1, wherein the positive gate voltage ranges from about 6V to about 12V.

3. The method for programming a charge-trapping nonvolatile memory cell as recited in claim 1, wherein the positive source voltage ranges from about 0.5V to about 3V.

4. The method for programming a charge-trapping nonvolatile memory cell as recited in claim 1, wherein the positive drain voltage is greater than a combinative voltage including the positive source voltage plus a voltage factor.

5. The method for programming a charge-trapping nonvolatile memory cell as recited in claim 4, wherein the voltage factor is about 2V.

6. The method for programming a charge-trapping nonvolatile memory cell as recited in claim 1, wherein the charge-trapping nonvolatile memory cell is an n-channel memory cell.

7. The method for programming a charge-trapping nonvolatile memory cell as recited in claim 1, wherein the charge-trapping nonvolatile memory cell includes a charge-trapping layer that is selected from the group consisting of silicon nitride ($Si_3N_4$), aluminum oxide ($Al_2O_3$), and hafnium oxide ($HfO_2$).

8. A method for programming a charge-trapping nonvolatile memory array, comprising:
    selecting a charge-trapping nonvolatile memory cell to be programmed from the charge-tra in nonvolatile memory array, the charge-trapping nonvolatile memory cell being capable of 2-bit operations;
    applying a first positive voltage to a first local bit line that is connected to a source of the charge-trapping nonvolatile memory cell;

applying a second positive voltage to a second local bit line that is connected to a drain of the charge-trapping nonvolatile memory cell such that the second positive voltage is greater than the first positive voltage; applying a third positive voltage to a word line that is connected to a polysilicon gate of the charge-trapping nonvolatile memory cell to be programmed; and grounding a substrate of the charge-trapping nonvolatile memory cell.

9. The method for programming a charge-trapping nonvolatile memory array as recited in claim 8, wherein the third positive voltage ranges from about 6V to about 12V.

10. The method for programming a charge-trapping nonvolatile memory array as recited in claim 8, wherein the first positive voltage ranges from about 0.5V to about 3V.

11. The method for programming a charge-trapping nonvolatile memory array as recited in claim 8, wherein the second positive voltage is greater than a combinative voltage including the first positive voltage plus a voltage factor.

12. The method for programming a charge-trapping nonvolatile memory array as recited in claim 11, wherein the voltage factor is about 2V.

13. The method for programming a charge-trapping nonvolatile memory array as recited in claim 8, wherein the charge-trapping nonvolatile memory array is a virtual ground array.

14. A method for programming a charge-trapping nonvolatile memory cell that is capable of 2-bit operations, comprising:

connecting a source terminal to a source of the charge-trapping nonvolatile memory cell that is capable of 2-bit operations and applying a positive source voltage to the source terminal of the charge-trapping nonvolatile memory cell;

connecting a drain terminal to a drain of the charge-trapping nonvolatile memory cell and applying a positive drain voltage to the drain terminal of the charge-trapping nonvolatile memory cell such that the positive drain voltage is greater than the positive source voltage;

connecting a gate terminal to a polysilicon gate of the charge-trapping nonvolatile memory cell and applying a positive gate voltage to the gate terminal of the charge-trapping nonvolatile memory cell; and connecting a substrate terminal to a substrate of the charge-trapping nonvolatile memory cell and grounding the substrate terminal of the charge-trapping nonvolatile memory cell.

15. The method for programming a charge-trapping nonvolatile memory cell as recited in claim 14, wherein the positive gate voltage ranges from about 6V to about 12V.

16. The method for programming a charge-trapping nonvolatile memory cell as recited in claim 14, wherein the positive source voltage ranges from about 0.5V to about 3V.

17. The method for programming a charge-trapping nonvolatile memory cell as recited in claim 14, wherein the positive drain voltage is greater than a combinative voltage including the positive source voltage plus a voltage factor.

18. The method for programming a charge-trapping nonvolatile memory cell as recited in claim 17, wherein the voltage factor is about 2V.

19. The method for programming a charge-trapping nonvolatile memory cell as recited in claim 14, wherein the charge-trapping nonvolatile memory cell is an n-channel memory cell.

\* \* \* \* \*